US010096724B2

(12) United States Patent
Van Buggenhout et al.

(10) Patent No.: US 10,096,724 B2
(45) Date of Patent: Oct. 9, 2018

(54) RADIATION DETECTOR COMPRISING A COMPENSATING SENSOR

(71) Applicant: Melexis Technologies NV, Tessenderlo (BE)

(72) Inventors: Carl Van Buggenhout, Aalst (BE); Appolonius Jacobus Van Der Wiel, Duisburg (BE); Luc Buydens, Kasterlee (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 14/951,554

(22) Filed: Nov. 25, 2015

(65) Prior Publication Data

US 2016/0149105 A1 May 26, 2016

(30) Foreign Application Priority Data

Nov. 25, 2014 (GB) .................................. 1420907.6

(51) Int. Cl.
 *H01L 31/02* (2006.01)
 *B81B 7/02* (2006.01)
 (Continued)

(52) U.S. Cl.
 CPC ............ *H01L 31/0203* (2013.01); *B81B 7/02* (2013.01); *G01J 1/0214* (2013.01); *G01J 1/0295* (2013.01);
 (Continued)

(58) Field of Classification Search
 CPC ...... G01K 1/04; G01J 1/04; G01J 5/12; G01J 2005/123; G01J 2005/126;
 (Continued)

(56) References Cited

U.S. PATENT DOCUMENTS 7,253,082 B2* 8/2007 Adachi ............. H01L 21/76251
 257/E21.567
7,262,412 B2* 8/2007 Schimert ............. H01L 27/1465
 250/338.1

(Continued)

FOREIGN PATENT DOCUMENTS

DE 10 2004 020 685 B3 9/2005
DE 10 2007 021 911 A1 11/2008

(Continued)

OTHER PUBLICATIONS

Great Britain Search Report from Great Britain Application No. GB1420907.6, dated Mar. 26, 2015.

(Continued)

*Primary Examiner* — Jose R Diaz
(74) *Attorney, Agent, or Firm* — Workman Nydegger

(57) ABSTRACT

A chip for radiation measurements, the chip comprising a first substrate comprising a first sensor and a second sensor. The chip moreover comprises a second substrate comprising a first cavity and a second cavity both with oblique walls. An internal layer is present on the inside of the second cavity. The second substrate is sealed to the first substrate with the cavities on the inside such that the first cavity is above the first sensor and the second cavity is above the second sensor.

16 Claims, 2 Drawing Sheets

(51) Int. Cl.
*G01J 5/12* (2006.01)
*H01L 31/0203* (2014.01)
*G01J 5/04* (2006.01)
*G01J 5/08* (2006.01)
*G01J 1/02* (2006.01)
*G01J 5/02* (2006.01)
*G01J 5/06* (2006.01)
*G01J 1/42* (2006.01)
*H01L 31/0216* (2014.01)
*H01L 27/144* (2006.01)
*H01L 31/09* (2006.01)
*H01L 35/28* (2006.01)
*H01L 35/34* (2006.01)

(52) U.S. Cl.
CPC ............. *G01J 1/4228* (2013.01); *G01J 5/024* (2013.01); *G01J 5/0225* (2013.01); *G01J 5/0285* (2013.01); *G01J 5/045* (2013.01); *G01J 5/06* (2013.01); *G01J 5/0803* (2013.01); *G01J 5/12* (2013.01); *H01L 27/144* (2013.01); *H01L 27/1443* (2013.01); *H01L 31/02164* (2013.01); *H01L 31/09* (2013.01); *H01L 35/28* (2013.01); *H01L 35/34* (2013.01); *B81B 2201/0207* (2013.01); *B81B 2203/0315* (2013.01); *G01J 2005/068* (2013.01)

(58) Field of Classification Search
CPC ........... H01L 21/76251; H01L 31/0203; H01L 35/28; H01L 25/041; H01L 25/042; H01L 25/047; H01L 51/107; B81B 7/02; B81B 2203/0315

See application file for complete search history.

(56) References Cited

U.S. PATENT DOCUMENTS

| | | | |
|---|---|---|---|
| 9,267,847 B2* | 2/2016 | Kassovski | G01J 5/16 |
| 9,725,304 B2* | 8/2017 | Zhang | B81B 7/02 |
| 2005/0081905 A1* | 4/2005 | Lan | G01K 7/04 |
| | | | 136/224 |
| 2007/0138395 A1* | 6/2007 | Lane | G01J 1/04 |
| | | | 250/353 |
| 2007/0262407 A1 | 11/2007 | Schimert et al. | |
| 2012/0097853 A1 | 4/2012 | Ouvrier-Buffet et al. | |
| 2016/0178443 A1* | 6/2016 | Emadi | G01J 5/16 |
| | | | 374/133 |

FOREIGN PATENT DOCUMENTS

| | | |
|---|---|---|
| EP | 2 172 753 B1 | 5/2011 |
| EP | 2975371 A1 | 1/2016 |
| JP | H0674820 A | 3/1994 |
| JP | H09-264784 A | 10/1997 |
| WO | 2006062809 A2 | 6/2006 |

OTHER PUBLICATIONS

Extended European Search Report from EP Application No. 15196154.7, dated Apr. 14, 2016.

* cited by examiner

RADIATION DETECTOR COMPRISING A COMPENSATING SENSOR

FIELD OF THE INVENTION

The present invention relates to the field of radiation detectors. More specifically it relates to a radiation detector comprising a reference sensor.

BACKGROUND OF THE INVENTION

Radiation sensors typically convert a radiative signal into an electrical signal. An example of such a radiation sensor is a thermopile sensor which is used for infrared sensing. In a thermopile sensor a plurality of thermocouples are coupled in series or in parallel. The conversion of the radiative signal into an electrical signal is a multi-stage conversion in which not only the thermo-electrical domain but also the optical domain and the thermal domain should be considered.

With regard to the optical domain, the electromagnetic radiation in the infrared spectral range and the absorption of the radiation onto a MEMS element should be considered. With regard to the thermal domain, the heat transfer through conduction, convection and radiation should be considered. With regard to the thermo-electrical domain, the Seebeck coefficient is of importance.

Considering the different domains there are several causes for errors in the resulting electrical signal. Different external factors, apart from the radiation to be measured, contribute to the resulting electrical output signal of the sensor. Compensation therefore can be done using a reference sensor.

Given the complexity in the conversion of the signal, several external factors contribute to the electrical signal, which external factors should preferably be compensated for.

EP2172753 is a prior art solution wherein a plurality of thermopile sensors are integrated in a base wafer. A filter wafer comprises infrared filters above the individual sensors. Thus it is possible to create differing spectral transmission characteristics for the filters in front of the different thermopile sensors. One of these sensors might be a reference sensor.

Ideally the reference sensor can compensate for all influences (except for the radiation) the environment has on the measurement sensor. Careful design of the reference sensor is required. In the ideal case the transfer function of the reference sensor would be the same as the transfer function of the IR signal detector. Moreover the radiation sensor should be preferably easy to manufacture.

Therefore there is room for improving radiation sensors comprising a reference sensor for compensating for external factors in the measurement result.

SUMMARY OF THE INVENTION

It is an object of embodiments of the present invention to provide efficient systems and methods for performing radiation measurements.

The above objective is accomplished by a method and device according to the present invention.

In a first aspect, the present invention provides a chip for radiation measurements. The chip comprises a first substrate comprising at least a first sensor and a second sensor. The chip also comprises a second substrate comprising at least a first cavity and a second cavity both with oblique walls. An internal layer preventing radiation from reaching the second sensor is present on the inside of the second cavity, and the second substrate is bonded, e.g. sealed, to the first substrate with the cavities on the inside such that the first cavity is above the first sensor and the second cavity is above the second sensor.

It is an advantage of embodiments of the present invention that the output signal of the second sensor can be used as a reference signal to remove unwanted effects present in the output signal of the first sensor. These unwanted effects may for instance be noise, drift of the sensor caused by temperature changes, or drift of the sensor caused be pressure changes. Other unwanted effects may be common-mode signals that depend on the object temperature and/or the temperature of the environment in a non-linear behaviour. It is an advantage of embodiments of the present invention that the internal layer can block radiation from reaching the second sensor. It is an advantage of embodiments of the present invention that the internal layer is on the inner side of the cavity, since it is possible to coat the complete inner side of the cavity with one layer in one step. This allows to use the second sensor as a reference sensor to the extent that the second sensor is subject to the same external parameters as the first sensor except for the external radiation coming from the object space which only reaches the first sensor. A reference signal coming from the second sensor caused by anything but radiation can be used to cancel out noise and drift in the first sensor. Also common-mode radiation can be cancelled out (e.g. radiation coming from the temperature of the second substrate, also called the cap; as the cap temperature depends both on the object temperature and on the ambient temperature and on the thermal resistance of the surrounding of the chip, this could be seen as a noise signal; it is a common-mode noise signal because both sensors see this radiation signal of the cap temperature). The signal from the first sensor will be composed of a baseline signal and a radiation induced signal. Since the radiation is blocked from reaching the second sensor the signal coming from the second sensor is only composed of the baseline signal. If both baseline signals are the same, the radiation induced signal can be derived from a measurement with both sensors. It is an advantage of embodiments of the present invention that the pressure in the first cavity and the pressure in the second cavity are the same. In embodiments of the present invention this is realized by having a channel between the first cavity and the second cavity. The pressure in the cavity has an impact on the baseline signal. A pressure difference would therefore introduce an error caused by a difference in the baseline signal between the first and the second sensor. An opening between both cavities guarantees an identical pressure in both cavities.

It is an advantage of embodiments of the present invention that the internal layer can block radiation from the first cavity towards the second cavity. The internal layer not only blocks radiation coming directly from the object space but it also blocks radiation entering the chip in the first cavity and being reflected towards the second cavity. It is an advantage of embodiments of the present invention that also indirect radiation is blocked from entering the second cavity. This way, optical cross-talk between both sensors is avoided.

It is an advantage of embodiments of the present invention that the internal layer can be processed in one single process step.

It is an advantage of embodiments of the present invention that an optical insulation is created between the first and the second pixel (so that the second pixel does not see the object space), while at the same time a thermal short-circuit is created between both pixels.

In a chip according to embodiments of the present invention, the internal layer may be a reflective layer or an absorption layer.

In embodiments of the present invention, the height of the second cavity may be smaller than the height of the first cavity. In such embodiments, no actual barrier needs to be present between both cavities. It is an advantage of such embodiments of the present invention that the pressure in the first cavity is inherently the same as the pressure in the second cavity, which improves temperature matching.

In alternative embodiments of the present invention, a barrier may be present between the first cavity and the second cavity. The internal layer may be present on the inside of the second cavity and at least partly on the barrier. This way, radiation from the first cavity is blocked from entering the second cavity by the presence of a barrier in between the first and second cavity. It is an advantage of embodiments of the present invention that the reflective/absorptive layer against the barrier is part of the internal layer and can be added in one single process step.

The barrier may be sealed to the first substrate. This prevents any radiation from entering the second cavity.

Alternatively, a channel may be present between the barrier and the first substrate, extending in the longitudinal direction of the channel from the first cavity towards the second cavity. Such channel in between the first and second cavity guarantees the same gas pressure in both cavities. It is an advantage of embodiments of the present invention that the channel size is small enough such that no radiation can pass from the first cavity towards the second cavity. In order to compensate for background effects on the first sensor, the second sensor should be influenced by the same conditions as the first sensor except for the radiation of the object under study. The second sensor should not receive any of the radiation of the object under study. Any other influencing parameters like for example the temperature, the pressure, radiation from hotspots in the first substrate are preferably the same for the first sensor and the second sensor. It is an advantage of embodiments of the present invention that, except for the radiation of the object under study that reaches the first sensor and is blocked from the second sensor, the other influencing parameters are the same for both sensors. Therefore, in embodiments of the present invention, the second sensor can be used to calibrate out the error caused by the other influencing parameters. In embodiments of the present invention the second sensor is matched with the first sensor by creating the same gas pressure while the optical isolation is preserved.

In embodiments of the present invention, the barrier may be partially sealed to the first substrate leaving a channel between the barrier and the first substrate, whereby the channel extends in the longitudinal direction of the channel from the first cavity towards the second cavity. The barrier thereby contributes to the mechanical strength of the connection between the first substrate and the second substrate, while at the same time leaving a small channel between the first cavity and the second cavity for equalizing the gas pressure.

In embodiments of the present invention, the internal layer also partly covers the inside of the first cavity. It is an advantage of embodiments of the present invention that radiation from the first cavity towards the second cavity is blocked by the internal layer present on at least the side wall of the first cavity facing the second cavity. It is an advantage of embodiments of the present invention that the radiation from the hotspots in the first substrate is reflected similarly in the first cavity as it is reflected in the second cavity. This permits to cancel the effect of hotspots by comparing the measurement of the first sensor with the measurement of the second sensor.

In a chip according to embodiments of the present invention, the first sensor and/or the second sensor may be thermopile sensors.

In a second aspect, the present invention provides a method for manufacturing a chip for radiation measurements. The method comprises a first step wherein a first cavity and a second cavity with oblique walls are etched in a second substrate; a next step wherein an internal layer is applied on the inner side of at least one of the cavities; and a further step wherein the second substrate is sealed to a first substrate comprising radiation sensors, such that the cavities enclose the radiation sensors. The internal layer can be applied in one processing step. This layer blocks radiation towards the second cavity.

In accordance with embodiments of the present invention, the etching in the first step may be a potassium hydroxide etching. It is an advantage of embodiments of the present invention that slanted walls are realized by potassium hydroxide etching. Slanted walls are especially advantageous with regard to applying the internal layer.

In embodiments of the present invention, the first cavity and the second cavity may be separate cavities. In embodiments of the present invention, during the sealing step no bond material is applied between the wall separating the two cavities and the first substrate. A channel interconnecting the first and second cavity can thus be realized without any additional processing step. It is sufficient to omit the bonding material between the wall separating the two cavities and the first substrate. Having a channel between the first and second cavity has as advantage that the pressure in the first and second cavity is always the same irrespective of the external circumstances. In alternative embodiments, the bond material does not need to be omitted between the wall separating the two cavities and the first substrate, but a groove may be provided in the wall separating the two cavities, which groove is left open and is not filled with bond material. Alternatively, the bond material could just be applied to a part of the wall separating the two cavities and the first substrate, thereby also creating a channel between the first and second cavity.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
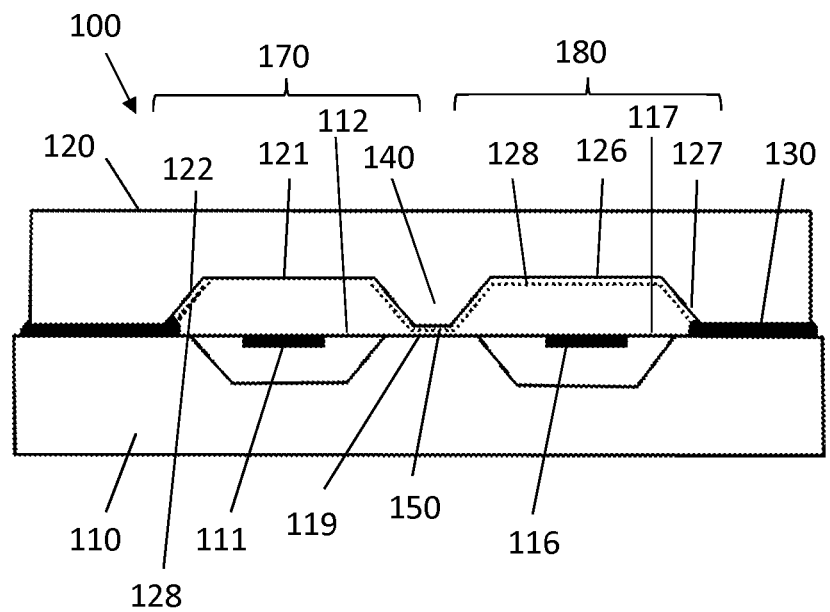
FIG. 1 schematically illustrates a chip comprising two sensors encapsulated by a first and a second sealed cavity comprising a barrier in between both cavities, according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "radiation" reference is made to electromagnetic radiation of any type, e.g. visible light, UV light, infra-red light, X-rays, gamma rays. The radiation may be in a specific frequency range. In particular embodiments of the present invention this range may be infrared range, for instance in the range between 400 GHz and 40 THz.

Where in embodiments of the present invention reference is made to the "object space", reference is made to the space where the radiation to be measured is emanating from.

Where in embodiments of the present invention reference is made to the "height" of a gap or the "height" of a cavity, the "height" is measured in a direction orthogonal to the substrate area.

Where in embodiments of the present invention reference is made to "KOH etching", reference is made to potassium hydroxide etching.

In a first aspect, the present invention relates to a sensor chip 100 for radiation measurements. In particular embodiments of the present invention the sensor chip is designed for detecting radiation in the infrared spectrum range. The sensor chip 100 comprises at least a first sensor 111 and a second sensor 116. The first sensor 111 is adapted for sensing the radiation coming from the object space and the second sensor 116 is used as a reference sensor. Both sensors are located in a first substrate 110, on a first membrane 112 and a second membrane 117, respectively. The chip 100 also comprises a second substrate 120, functioning as a cap, comprising at least a first cavity 121 and a second cavity 126. Both cavities 121, 126 have oblique walls 122, 127. The second substrate 120 is sealed to the first substrate 110 with the first cavity 121 and the second cavity 126 oriented towards the inside, such that the first cavity 121 is located above the first sensor 111 and the second cavity 126 is located above the second sensor 116.

In embodiments of the present invention a wafer bonding technology may be used to bond the second substrate 120 to the first substrate 110. The first and second cavities 121, 126 are thereby hermetically sealed over the first and second sensors 111, 116. By hermetically sealing the cavity the first sensor is thermally isolated from the second sensor and from the second substrate 120.

The cavities 121, 126 might, depending on the applied wafer bonding technology, contain gas molecules that fill up the cavity and constitute to a predetermined pressure. The pressure of the gas in the cavity has an important influence on the thermal conductivity of the gas in the cavity. This thermal conduction is a leakage path for the heat transfer from the first sensor 111 to the second sensor 116, to the first substrate 110, and to the second substrate 120. For that reason, this gas pressure contributes highly to the sensitivity of the sensors. In embodiments of the present invention where the second sensor is used as a reference sensor it is therefore advantageous that the pressure in the first cavity 121 is the same, or at least has a same order of magnitude, as the pressure in the second cavity 126.

In order to obtain this similar pressure in both cavities, in accordance with embodiments of the present invention, the cavities 121, 126 in the second substrate 120 are etched. The etching technique must be such that oblique walls 122, 127 are obtained. The angle between the wall and the substrate surface may be 45° or 54.7° as is obtained by KOH etching. It is an advantage of embodiments of the present invention that the cavity wall has an orientation (e.g. 45° or 54.7°) resulting in total internal reflection. In embodiments of the present invention a barrier 140 is present between the first cavity 121 and the second cavity 126. This barrier 140 may be created during etching (e.g. KOH etching) of the second substrate 120 by intentionally leaving, i.e. not removing, a portion of the second substrate 120 between the first and second cavity 121, 126.

In accordance with embodiments of the present invention, an internal layer 128 is present on the inside of the second cavity 126. The internal layer 128 on the inside of the second cavity 126 is such that it blocks radiation from entering the second cavity 126 and thus from reaching the second sensor 116. The internal layer 128 therefore shields the second sensor 116 (i.e. the reference sensor) from the object space.

In embodiments of the present invention the internal layer 128 reflects incoming radiation. In particular embodiments, the internal layer 128 may be reflective for infrared radiation. Such a layer may for example be made of aluminium. In other embodiments of the present invention the internal layer is an absorbing layer for absorbing the incoming radiation. In embodiments of the present invention the internal layer attenuates the incoming radiation by more than 10 dB preferably more than 20 dB before it reaches the second sensor 116.

The internal layer 128 may be provided at least at the top wall (the wall away from the second sensor 116), and preferably also at the slanted side walls of the second cavity 126. In embodiments of the present invention the internal layer 128 is applied on the complete interior wall of the second cavity 126. The internal layer 128 may be provided by standard semiconductor processing, for instance by depositing and patterning the internal layer 128 on the inner side of the second cavity 126. The internal layer 128 may cover at least part of the barrier 140. By the internal layer 128, an optical shielding is created from the object space for the second sensor 116.

Compared to cavities with vertical walls (i.e. walls orthogonal to the substrate surface; having an angle of 90° with the substrate surface) it is an advantage of embodiments of the present invention that the cavities have oblique walls as this improves the deposition of the internal layer 128 on the side walls.

In embodiments of the present invention also the first cavity 121 is partly coated so as to create an aperture stop layer. The first cavity 121 may for instance be coated at the side walls, as illustrated in FIG. 1, and could even be coated also to the top wall of the first cavity. At the top wall of the first cavity, this aperture stop layer could be structured so that the first sensor only sees a pre-defined field of the object space. The coating at the side wall of the first cavity 121 formed by the barrier 140 may be continuous with the coating at the inside of the second cavity 126. By the thus formed aperture stop layer, the first sensor sees the object space.

In embodiments of the present invention the first and second sensors 111, 116 are thermopile sensors.

In the exemplary embodiment of the present invention illustrated in FIG. 1 glass-frit wafer bonding (seal material 130) is applied to connect the first substrate 110 to the second substrate 120. The first substrate 110 comprises a first sensor 111, a second sensor 116 and a barrier 119 between the first sensor and the second sensor. The second substrate 120 comprises a first cavity 121 with oblique walls 122 and a second cavity 126 with oblique wall 127. The interior of the second cavity 126 is covered with an internal layer 128. In embodiments of the present invention the walls of the first cavity 121 also might have an internal layer for reflecting or absorbing radiation. In embodiments of the present invention the internal layer 128 is present on both sides of the barrier 140. In the exemplary embodiment of the present invention illustrated in FIG. 1 a barrier 140 is present between the first cavity 121 and the second cavity 126. By omitting the seal material between the barrier 140 in the second substrate and the barrier 119 in the first substrate a channel 150 between the first cavity and the second cavity is left open. Alternatively, in embodiments of the present invention seal material between the barrier 140 in the second substrate 120 and the barrier 119 in the first substrate 110 may be present, but may be at least partially omitted, thus leaving a channel between the first cavity 121 and the second cavity 126. In particular embodiments, a groove, for instance a V-groove, may be provided at the bottom side of the barrier 140 or at the top side of the barrier 119, which groove is not filled with seal material such that a channel is present between the first cavity 121 and the second cavity 126. If still some seal material is present between the barrier 140 in the second substrate 120 and the barrier 119 in the first substrate 110, this increases the strength of the chip 100 compared to a chip 100 where no such seal material would be present between the barrier 140 in the second substrate 120 and barrier 119 in the first substrate 110. In preferred embodiments of the present invention, when partially sealing (or not sealing) the barrier 140 to the barrier 119, a channel is left open between the first cavity 121 and second cavity 126.

Figure 3:
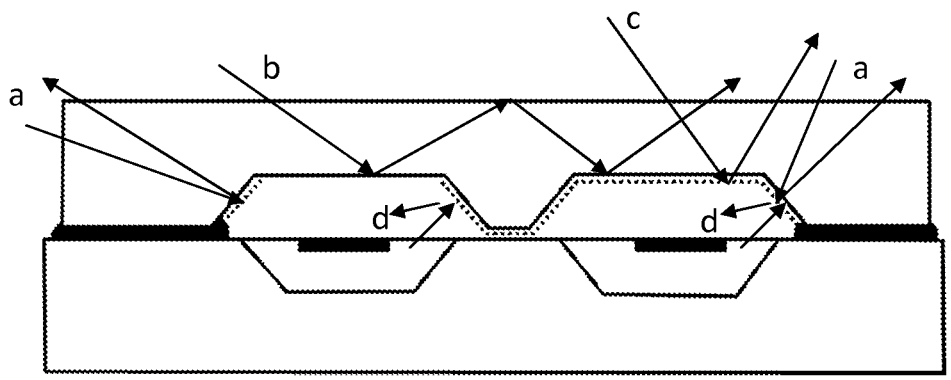
FIG. 3 schematically illustrates radiation reflections on a chip in accordance with embodiments of the present invention.
Figure 4:
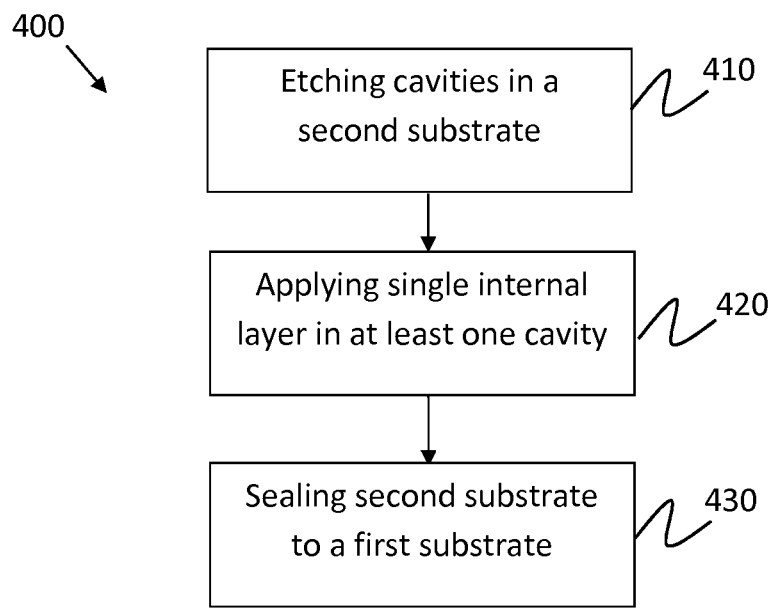
FIG. 4 shows a flow chart illustrating steps in an exemplary method for making a chip for detecting radiation, according to an embodiment of the present invention.

FIG. 3 shows a schematic representation of an exemplary embodiment of a chip according to the present invention. The same embodiment is shown as in FIG. 1; however, in this figure arrows are provided indicating incoming radiation and reflections thereof. In the embodiment of FIG. 3 the internal layer 128 is a reflective layer. Arrows "a" show a direct reflection of radiation coming from the object space onto the internal layer 128 at the oblique walls of the cavity. Arrows "b" show radiation which is first (partially) reflected on the first cavity 121 and on the edge between the second substrate 120 and the environment before the radiation is reflected by the internal layer 128. Arrows "c" show a direct reflection of radiation coming from the object space on the internal layer at the top of the second cavity 126. Arrows "d" show the reflection on the inner side of the internal layer 128. By applying one internal layer on the inner side of the second cavity all radiation (also indirect reflections) from the object space towards the second sensor 116 can be blocked. Radiation "c" coming from the object space is directly reflected back towards the object space. Radiation "b" illustrates multiple reflected radiation. It is an advantage of embodiments of the present invention that also the multiple reflected radiation is blocked by the internal layer 128. Radiation "a" is radiation from the object space towards the sidewalls of the cavity. In the embodiment illustrated in FIG. 3 the internal layer 128 is also applied on the oblique sidewalls of the first cavity 121, therefore also this radiation "a" is blocked from entering the first cavity 121 via the sidewall of the first cavity 121. Radiation "d" coming from the first substrate 110 (e.g. a CMOS wafer), is reflected against the oblique wall of the cavity. In case of the second cavity 126 this is directly towards the second sensor 116 which is used as reference sensor. The radiation "d" coming from the first wafer may be caused by hotspots from the circuit on the chip 100. If the radiation from the hotspots is reaching both the first sensor 111 and the second sensor 116 similarly, the second sensor 116 can also be used to compensate for hotspots from the circuit on the chip 100.

In embodiments of the present invention the size of the hotspots is small compared to the distance between the two sensors. These hotspots might for example emanate from heating in the CMOS circuitry. In embodiments of the present invention the CMOS circuitry is designed such that the radiation reaching the first sensor is equal to the radiation reaching the second sensor. The layout of the CMOS circuitry might for example be optimized in that sense that an almost equal amount of hotspots are seen by each of the sensors.

In embodiments of the present invention the first substrate 110 may for example be made of silicon. Silicon has a high thermal conductivity and as such averages out heat spots over the whole substrate surface. Therefore, in these embodiments, the radiation "d" towards the first sensor is similar as the radiation "d" towards the second sensor.

In embodiments of the present invention the barrier 140 in the second substrate 120 between the first 121 and second 126 cavity may be sealed to the first substrate 110, as stated above. In other embodiments of the present invention, as illustrated in FIG. 1, a channel 150 is present between the barrier 140 and the first substrate 110. In embodiments of the present invention the height of the gap forming the channel 150 is between 1 µm and 15 µm preferably between 5 µm and 15 µm. The length of the gap, i.e. the distance between the first cavity 121 and the second cavity 126 along the gap, is between 20 µm and 200 µm, preferably as small as possible in order to limit the total chip size. The length of the gap might be designed in relationship to the height of the gap so that radiation is not transmitted nor reflected by multiple reflections between the two cavities. This gap may be realized by omitting the sealing material (e.g. glass-frit material) between the first and second substrate at the location of the barrier 140. In embodiments of the present invention the dimensions of the channel 150 between the first cavity 121 and the second cavity 126 are small enough to prevent radiation from one cavity to the other cavity and big enough to have the same pressure in the first cavity as the pressure in the second cavity. It is an advantage of embodiments of the present invention that the first sensor 111 and the second sensor 116 have a similar or preferably the same transfer function, as in this situation the sensitivities of both sensors will be matched and as a result their responses can be subtracted in the electrical domain or the signals of both sensors can be processed in order to achieve a signal without common-mode noise.

The chip 100 has preferably a second sensor 116 (the reference sensor) that has exactly the same sensitivity-dependence as the first sensor 111 intended for detecting the object signal. Embodiments of the present invention are not restricted to a first sensor 111 and a second sensor 116 but may comprise a plurality of sensors. One reference sensor (like the second sensor 116) may be shared among multiple sensors for detecting the object signal. In embodiments of the present invention where the external parameters influencing the output signal of the first and second sensor 111, 116 are the same also the output signals of both sensors will be the same (except for the presence of noise).

In preferred embodiments of the present invention the reference sensor 116 has the same transfer function as the first sensor 111. Since the gas pressure has an important influence on the thermal conductivity of the gas, it is an advantage of embodiments of the present invention that the gas pressure in the first cavity is the same as the gas pressure in the second cavity, as this is required for having the same transfer function for both sensors.

Figure 2:
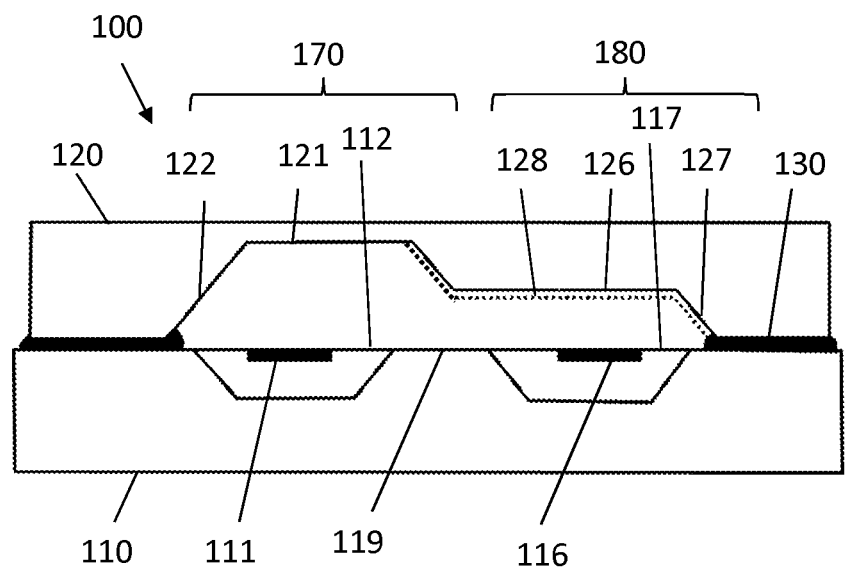
FIG. 2 schematically illustrates a chip comprising two sensors encapsulated by only 1 cavity wherein the height of the cavity can be different for each of the two sensors, according to embodiments of the present invention.

In another exemplary embodiment of the present invention illustrated in FIG. 2, no barrier is present between the first cavity 121 and the second cavity 126. Instead, the height of the second cavity 126 is made smaller than the height of the first cavity 121 to prevent radiation from the object space, entering the first cavity 121, from entering the second cavity 126. The smallest height that can be obtained for the second cavity depends on the wafer bonding technology. For deep vacuum wafer bonding technologies, the height of the second cavity can be smaller than 15 um, or even smaller than 5um, or even close to 0 µm. An internal layer 128 is applied on the inside of the second cavity 126 and on the wall of the first cavity 121 neighbouring the second cavity 126. This layer prevents radiation from reaching the second sensor 116. As no barrier is present between the first cavity 121 and the second cavity 126 the pressure in both cavities will be the same and no additional gap is required to ensure this. Similar as in the embodiment of FIG. 1, also in this embodiment the first substrate 110 is sealed to the second substrate 120 using seal material 130. A first sensor 111, a second sensor 116 and a barrier 119 between both sensors are present in the first substrate 110. In embodiments of the present invention instead of glass-frit bonding another bonding technology with smaller thickness might be applied. This might for example be done in embodiments where no barrier is present between the first cavity and the second cavity, as for instance in embodiments similar to the one illustrated in FIG. 2, the present invention, however, not being limited thereto as already explained higher. It is an advantage of embodiments of the present invention that the thickness of the bondframe is smaller than the thickness of the glass-frit bonding.

In a second aspect, embodiments of the present invention relate to a method 400 for manufacturing a chip 100 for performing radiation measurements. The radiation concerned may be in the infrared frequency range. The method comprises:
- a first step 410 wherein a first cavity 121 and a second cavity 126 with oblique walls 122, 127 are provided, e.g. etched, in a second substrate 120,
- a next step 420 wherein an internal layer 128 is applied on the inner side of at least one of the cavities 126,
- a next step 430 wherein the second substrate 120 is sealed to a first substrate 110 wherein the first substrate 110 comprises radiation sensors 111, 116.

The etching applied in the first step 410 may be KOH etching or any other technique which permits etching oblique walls.

In embodiments of the present invention the internal layer 128 is applied using aluminium evaporation.

In embodiments of the present invention the first substrate 110 may be sealed to the second substrate 120 using glass-frit bonding or any other bonding type, for instance a bonding technology that provides a thinner bondframe. By using glass-fit bonding, an intermediate glass layer is applied between the first and second substrates. The bonding may be performed at a predetermined pressure in an environment containing specific gas molecules such that after sealing the cavities 121, 126 are filled with a predetermined gas at a predetermined pressure.

The invention claimed is:

1. A chip for radiation measurements, the chip comprising
a first substrate comprising at least a first sensor and a second sensor,
a second substrate comprising at least a first cavity and a second cavity both with oblique walls,
wherein an internal layer is present on the inside of the second cavity, the internal layer being configured to attenuate incoming radiation by more than 10 dB before it reaches the second sensor, and
wherein the second substrate is sealed to the first substrate with the cavities on the inside such that the first cavity is above the first sensor and the second cavity is above the second sensor.

2. A chip according to claim 1, wherein the internal layer is a reflective layer.

3. A chip according to claim 1, wherein the internal layer is an absorption layer.

4. A chip according to claim 1 wherein the height of the second cavity is smaller than the height of the first cavity.

5. A chip according to claim 1 wherein a barrier is present between the first cavity and the second cavity and wherein the internal layer is present on the inside of the second cavity and at least partly on the barrier.

6. A chip according to claim 5, wherein the barrier is sealed to the first substrate.

7. A chip according to claim 5, wherein a channel is present between the barrier and the first substrate extending from the first cavity towards the second cavity.

8. A chip according to claim 5, wherein the barrier is partially sealed to the first substrate leaving a channel between the barrier and the first substrate whereby the channel extends from the first cavity to the second cavity.

9. A chip according to claim 1, wherein the internal layer also partly covers the inside of the first cavity.

10. A chip according to claim 1, wherein the first sensor and/or the second sensor are thermopile sensors.

11. A chip according to claim 1, wherein the internal layer is provided at least at the top wall of the second cavity and that the internal layer also covers at least the side wall of the first cavity facing the second cavity.

12. A chip comprising:
a first substrate that includes a first sensor and a second sensor
wherein the first sensor is configured to sense incoming radiation and the second sensor is a reference sensor; and
a second substrate coupled to the first substrate, the second substrate defining a first cavity and a second cavity;
wherein the first cavity is arranged above the first sensor, the first cavity being defined at least by first sidewalls, the first sidewalls including first oblique sidewalls;
wherein the second cavity is arranged above the second sensor, the second cavity being defined at least by second sidewalls, the second sidewalls including second oblique sidewalls;
wherein the chip further includes an internal layer arranged on an inside portion of the second cavity, and
the internal layer is configured to attenuate incoming radiation by more than 10 dB before it reaches the second sensor.

13. The chip according to claim 12, wherein the internal layer arranged on the inside of the second cavity is arranged on at least a portion of the second oblique sidewalls.

14. A chip according to claim 12, wherein the internal layer is provided at least at a top wall defining the second cavity, the top wall of the second cavity directly opposing the second sensor.

15. A chip according to claim 12, wherein the internal layer covers at least a portion of the first sidewalls of the first cavity, the portion of the first sidewalls of the first cavity covered by the internal layer being a portion of the first sidewalls being closest to the second cavity.

16. A chip according to claim 12, wherein the internal layer partly covers at least a portion of an inside surface of the first cavity.

* * * * *